United States Patent
Jang et al.

(10) Patent No.: US 9,899,587 B2
(45) Date of Patent: Feb. 20, 2018

(54) LEAD FRAME AND LIGHT EMITTING DIODE PACKAGE HAVING THE SAME

(71) Applicant: ADVANCED OPTOELECTRONIC TECHNOLOGY, INC., Hsinchu Hsien (TW)

(72) Inventors: Yau-Tzu Jang, Hsinchu (TW); Yu-Liang Huang, Hsinchu (TW); Wen-Liang Tseng, Hsinchu (TW); Pin-Chuan Chen, Hsinchu (TW); Lung-Hsin Chen, Hsinchu (TW); Hsing-Fen Lo, Hsinchu (TW); Chao-Hsiung Chang, Hsinchu (TW); Che-Hsang Huang, Hsinchu (TW); Yu-Lun Hsieh, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 15/434,173

(22) Filed: Feb. 16, 2017

(65) Prior Publication Data
US 2017/0162477 A1    Jun. 8, 2017

Related U.S. Application Data

(60) Continuation-in-part of application No. 14/876,980, filed on Oct. 7, 2015, now Pat. No. 9,620,692, which
(Continued)

(30) Foreign Application Priority Data

Dec. 18, 2012 (CN) .......................... 2012 1 0551102

(51) Int. Cl.
  *H01L 33/62* (2010.01)
  *H01L 33/64* (2010.01)
  (Continued)

(52) U.S. Cl.
  CPC ........ *H01L 33/647* (2013.01); *H01L 25/0753* (2013.01); *H01L 25/167* (2013.01);
  (Continued)

(58) Field of Classification Search
  CPC ................................... H01L 33/0004–33/648
  See application file for complete search history.

(56) References Cited

U.S. PATENT DOCUMENTS

2012/0292643 A1* 11/2012 Sawada ............... H04N 1/0285
257/80

* cited by examiner

*Primary Examiner* — Cuong B Nguyen
(74) *Attorney, Agent, or Firm* — ScienBiziP, P.C.

(57) ABSTRACT

A lead frame for an LED package includes a substrate and a bonding electrode, a first connecting electrode, and a second connecting electrode embedded in the substrate. A top surface of the bonding electrode includes a first bonding surface and a second bonding surface spaced from the first bonding surface. A top surface of the first connecting electrode includes separated first and second connecting surfaces. Top surfaces of the bonding electrode, the first connecting electrode, and the second connecting electrode are exposed, and support and electrically connect with light emitting chips. LED packages can be mounted on the lead frame and electrically connect with each other. The conductive layout of the lead frame further permits installation of a zener diode which can be connected to the LED packages in series or in parallel.

4 Claims, 12 Drawing Sheets

Related U.S. Application Data is a division of application No. 14/059,463, filed on Oct. 22, 2013, now Pat. No. 9,184,358.

(51) Int. Cl.
    *H01L 25/075*     (2006.01)
    *H01L 33/60*     (2010.01)
    *H01L 25/16*     (2006.01)
    *H01L 29/866*     (2006.01)
    *H01L 33/52*     (2010.01)
    *H01L 27/02*     (2006.01)
    *H01L 33/50*     (2010.01)
    *H01L 33/56*     (2010.01)

(52) U.S. Cl.
    CPC ........ *H01L 27/0248* (2013.01); *H01L 29/866* (2013.01); *H01L 33/502* (2013.01); *H01L 33/52* (2013.01); *H01L 33/56* (2013.01); *H01L 33/60* (2013.01); *H01L 33/62* (2013.01); *H01L 2224/48137* (2013.01)

LEAD FRAME AND LIGHT EMITTING DIODE PACKAGE HAVING THE SAME

CROSS-REFERENCE TO RELATED APPLICATIONS

This is a divisional application of patent application Ser. No. 14/876,980, filed on Oct. 7, 2015, entitled "LEAD FRAME AND LIGHT EMITTING DIODE PACKAGE HAVING THE SAME", assigned to the same assignee, which is based on and claims priority to Chinese Patent Application No. 201210551102.3 filed on Dec. 18, 2012, the contents of which are incorporated by reference herein.

FIELD

The disclosure generally relates to a lead frame and a light emitting diode package having the lead frame, wherein heat dissipation from the light emitting diode package is improved and electrical wiring is versatile.

BACKGROUND

A typical light emitting diode package includes a substrate, a first electrode and a second electrode arranged on the substrate, and a plurality of light emitting chips mounted on the substrate and electrically connecting to the first and second electrodes.

In a typical light emitting diode (LED) package, only two electrodes are provided to supply electricity to the light emitting chips, such that the plurality of light emitting chips can only be connected in parallel with a power source. Furthermore, the typical LED package has a limited heat dissipation area.

BRIEF DESCRIPTION OF THE DRAWINGS

Implementations of the present technology will now be described, by way of example only, with reference to the attached figures.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure. The description is not to be considered as limiting the scope of the embodiments described herein.

The term "comprising" means "including, but not necessarily limited to"; it specifically indicates open-ended inclusion or membership in a so-described combination, group, series, and the like.

Figure 1:
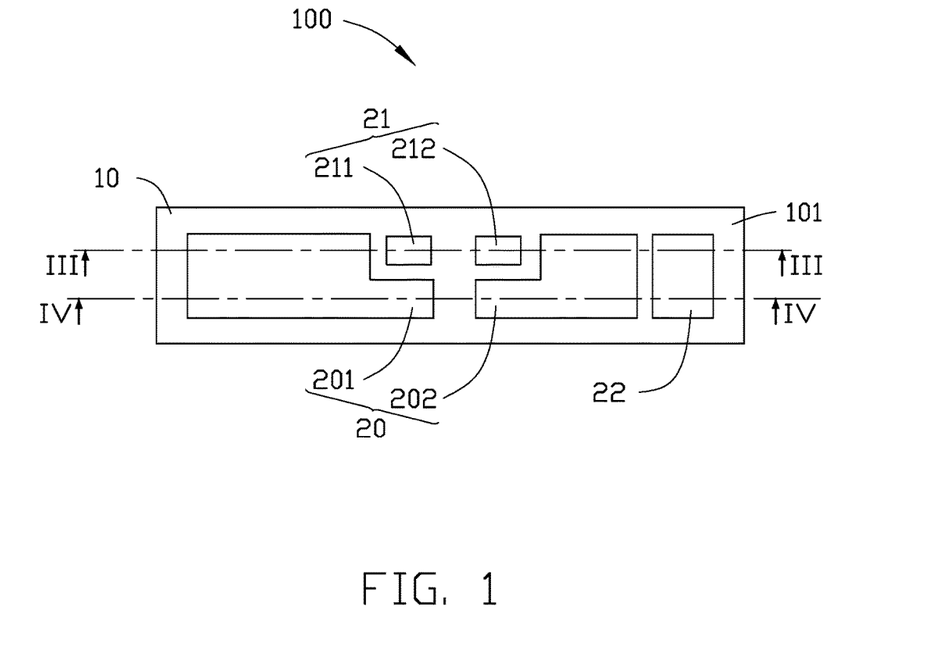
FIG. 1 is a top planar view of a lead frame in accordance with an exemplary embodiment of the present disclosure.
Figure 2:
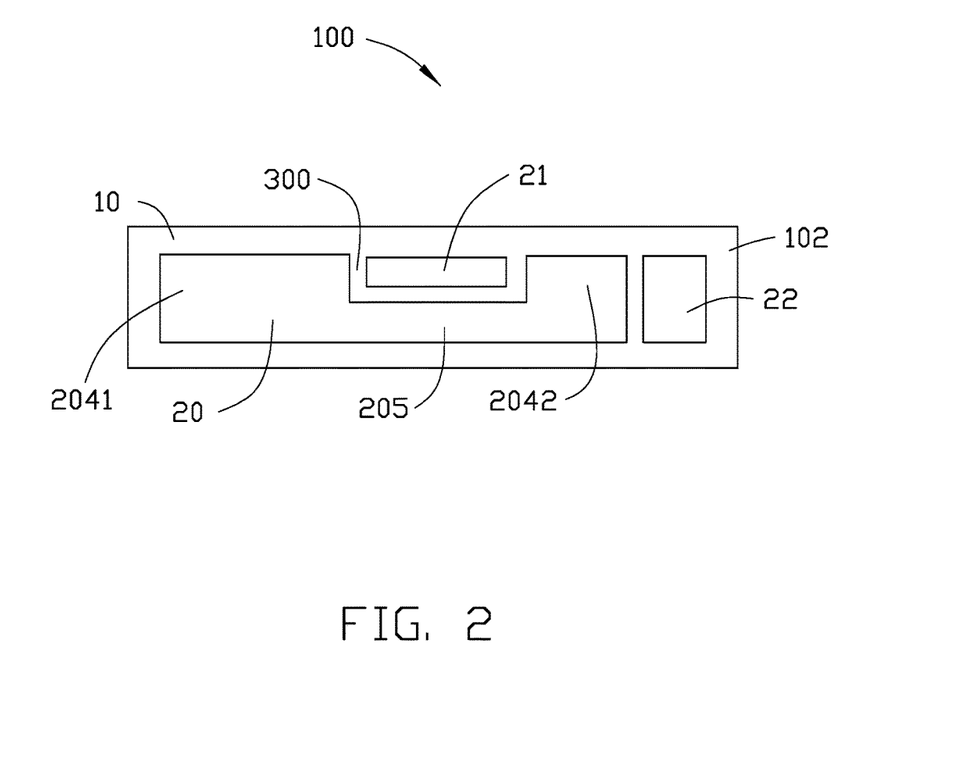
FIG. 2 is a bottom plan view of the lead frame of FIG. 1.

Referring to FIGS. 1-2, a lead frame 100 in accordance with an exemplary embodiment of the present disclosure is provided. The lead frame 100 includes a substrate 10, a bonding electrode 20, a first connecting electrode 21, and a second connecting electrode 22. The bonding electrode 20, the first connecting electrode 21, and the second connecting electrode 22 are spaced apart from each other.

The substrate 10 includes a flat top surface 101 and a flat bottom surface 102. The flat bottom surface 102 is facing away from and parallel to the top surface 101.

The bonding electrode 20, the first connecting electrode 21, and the second connecting electrode 22 are embedded in the substrate 10, and each have the same coplanar as the substrate 10. That is, top surfaces of the bonding electrode 20, the first connecting electrode 21, and the second connecting electrodes 22 are exposed but coplanar with the top surface 101 of the substrate 10. The bottom surfaces of the bonding electrode 20, the first connecting electrode 21, and the second connecting electrode 22 are exposed from but coplanar with the bottom surface 102 of the substrate 10.

Referring to FIG. 2, the bonding electrode 20 includes a first connecting portion 2041, a second connecting portion 2042, and a main connecting portion 205 connecting the first and second connecting portions 2041, 2042.

The first and second connecting portions 2041, 2042 are parallel to each other. The main connecting portion 205 is located between the first and second connecting portions 2041, 2042. Opposite ends of the main connecting portion 205 connect with inner ends of the first and second connecting portions 2041, 2042 respectively.

A width of the first connecting portion 2041 equals a width of the second connecting portion 2042. The width of the first connecting portion 2041 is larger than a width of the main connecting portion 205. A recess 300 is defined among the first connecting portion 2041, the second connecting portion 2042, and the main connecting portion 205.

In at least one embodiment, the first and second connecting portions 2041, 2042 are integrally formed with the main connecting portion 205.

The first connecting electrode 21 is located in the recess 300 and is surrounded by the first connecting portion 2041, the second connecting portion 2042, and the main connecting portion 205. The first connecting electrode 21 is spaced apart from the first connecting portion 2041, the second connecting portion 2042, and the main connecting portion 205.

In at least one embodiment, the second connecting electrode 22 is located at a right side of the bonding electrode 20 along a longitudinal direction of the substrate 10 or located on an end of the substrate 10. The second connecting electrode 22 is spaced apart from the bonding electrode 20. The bottom surface of the bonding electrode 20 occupies more than eighty percent of the entire area of the surface lead frame 100. The bonding electrode 20, the first connecting electrode 21, and the second connecting electrode 22 are made of metal or metallic materials with good thermal conductivity.

Figure 4:
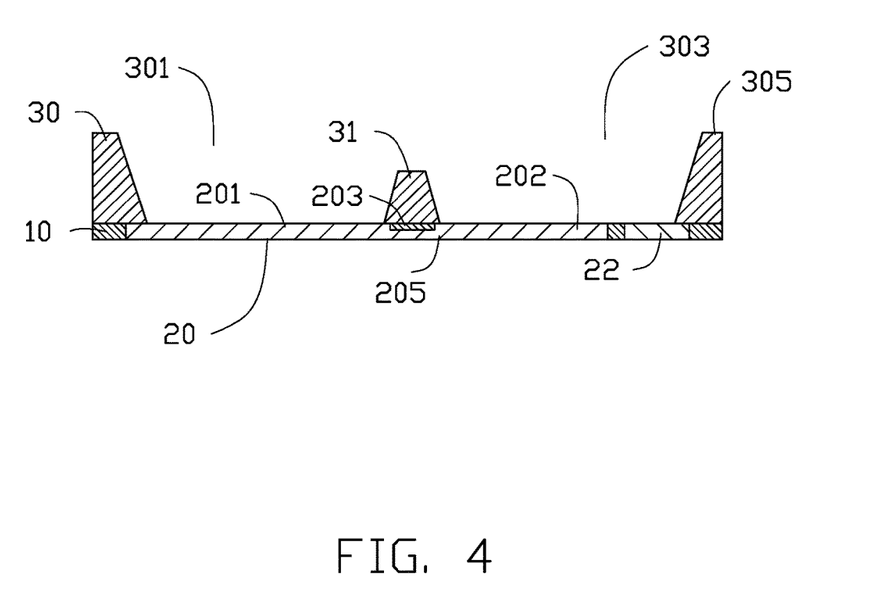
FIG. 4 is a cross-sectional view of the lead frame of FIG. 1 with a reflecting cup on the lead frame of FIG. 1, taken along a line IV-IV of the lead frame of FIG. 1.

Referring to FIG. 4, a top end of the main connecting portion 205 of the bonding electrode 20 along with a width direction of the bonding electrode 20 defines a cavity 203. The cavity 203 is recessed along a direction from a top surface of the bonding electrode 20 towards a bottom surface of the main connecting portion 205. The cavity 203 does not penetrate through the entire thickness of bonding electrode 20. A depth of the cavity 203 preferably equals one half of the thickness of the bonding electrode 20 in the exemplary embodiment.

In at least one embodiment, a first bonding surface 201 and a second bonding surface 202 are defined by the cavity 203 in the top surface of the bonding electrode 20.

Figure 3:
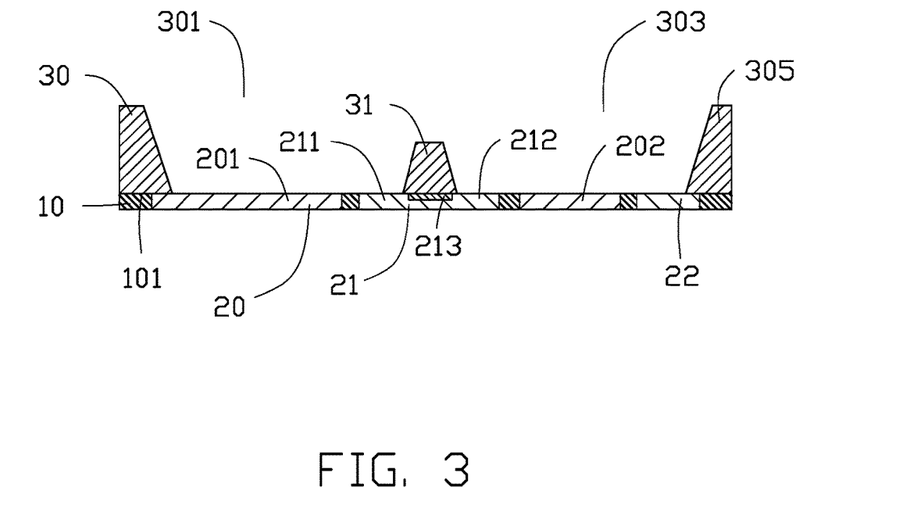
FIG. 3 is a cross-sectional view of the lead frame of FIG. 1 with a reflecting cup on the lead frame of FIG. 1, taken along a line of the lead frame of FIG. 1.

Referring to FIG. 3-4, a top end of the first connecting electrode 21 along a transverse direction of the substrate 10 defines a through groove 2213. The groove 213 is recessed along a direction from the top surface of the first connecting electrode 21 towards the bottom surface of the first connecting electrode 21. The groove 213 does not penetrate through the full thickness of the first connecting electrode 21. A depth of the groove 213 can equal the depth of the cavity 203 in the bonding electrode 20. A width of the groove 213 equals that of the cavity 203 in the bonding electrode 20. In at least one embodiment, the cavity 203 is longitudinally aligned with the groove 213 along the substrate 10.

The presence of the groove 213 divides the top surface of the first connecting electrode 21 into a first connecting surface 211 and a second connecting surface 212, each being located at opposite sides of the groove 213.

A reflector 30 is located on the top surface 101 of the substrate 10. The reflector 30 covers an outer periphery of the bonding electrode 20, an outer periphery of the first connecting electrode 21, and an outer periphery of the second connecting electrode 22.

The reflector 30 is made of polymeric materials, such as Epoxy Molding Compound (EMC) or Silicone Molding Compound (SMC).

In at least one embodiment, the reflector 30 includes a first receiving portion 301 and a second receiving portion 303 separated from the first receiving portion 301 by a dam 31. The dam 31 is located at a central portion of the reflector 30. The dam 31 extends transversely along the substrate 10, and is over the cavity 203 and the groove 213 as shown in FIGS. 3 and 4. A part of the substrate 10 fills in the cavity 203 and the groove 213.

A width of the dam 31 gradually decreases from a bottom end on the substrate 10 towards a top end far away from the substrate 10. The width of the bottom end of the dam 31 is larger than the width of the cavity 203, but is less than the width of the first connecting electrode 21 longitudinally along the substrate 10 as shown in FIG. 4.

The first bonding surface 201 of the bonding electrode 20 and the first connecting surface 211 of the first connecting electrode 21 are exposed at the bottom of the first receiving portion 301 of the reflector 30 as shown in FIG. 3. The second bonding surface 202 of the bonding electrode 20, the second connecting surface 212 of the first connecting electrode 21, and the top surface of the second connecting electrode 22 are exposed at the bottom of the second receiving portion 303 of the reflector 30. In this embodiment, a height of the dam 31 is less than a height of the surrounding portion 305 of the reflector 30.

Alternatively, the reflector 30 can be formed with the substrate 10 as a single piece. The reflector 30 is made as a layer of a polymer material, wherein the reflector 30 and the substrate 10 are made of the same material.

Figure 5:
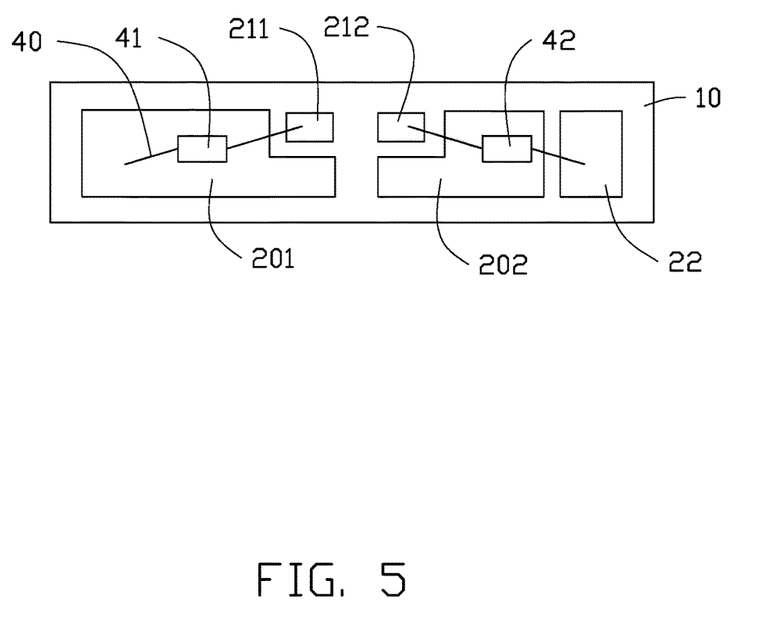
FIG. 5 is a top planar view of a light emitting diode package having two light emitting chips electrically connecting with each other in series on the lead frame of FIG. 1.
Figure 6:
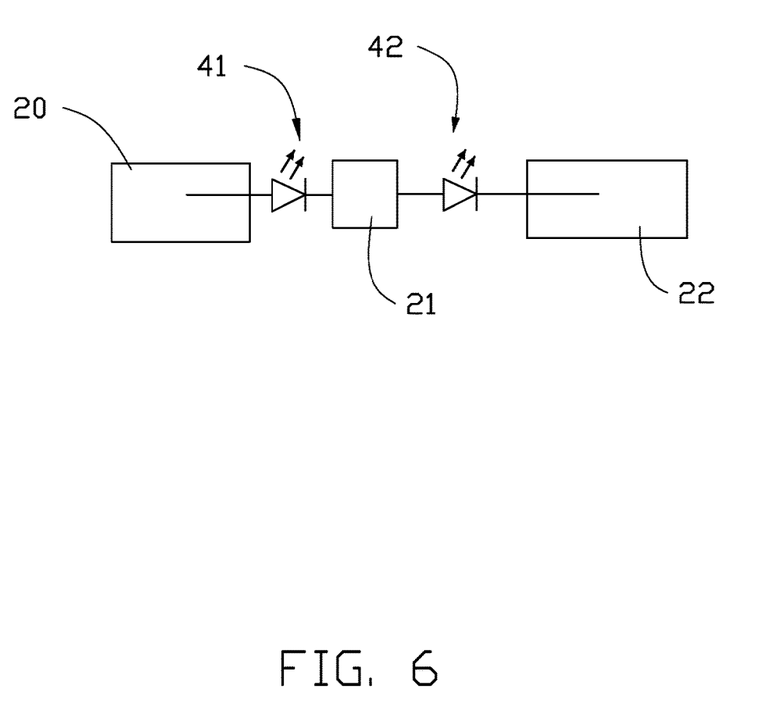
FIG. 6 is an equivalent circuit diagram of the light emitting diode package of FIG. 5.

Referring to FIGS. 5-6, a first light emitting chip 41 is mounted on the first bonding surface 201 and a second light emitting chip 42 is mounted on the second bonding surface 202. The first light emitting chip 41 electrically connects with the first bonding surface 201 and the first connecting surface 211 of the first connecting electrode 21 by two wires 40. The second light emitting chip 42 also electrically connects with the second connecting surface 212 of the first connecting electrode 21 and the second connecting electrode 22 by two wires 40. The first bonding surface 201 and the second bonding surface 202 being connected by the bottom end of the bonding electrode 20, the first connecting surface 211 and the second connecting surface 212 are thus connected by the bottom end of the first connecting electrode 21. The first light emitting chip 41 and the second light emitting chip 42 electrically connect with each other in series, as shown in FIG. 6.

Figure 7:
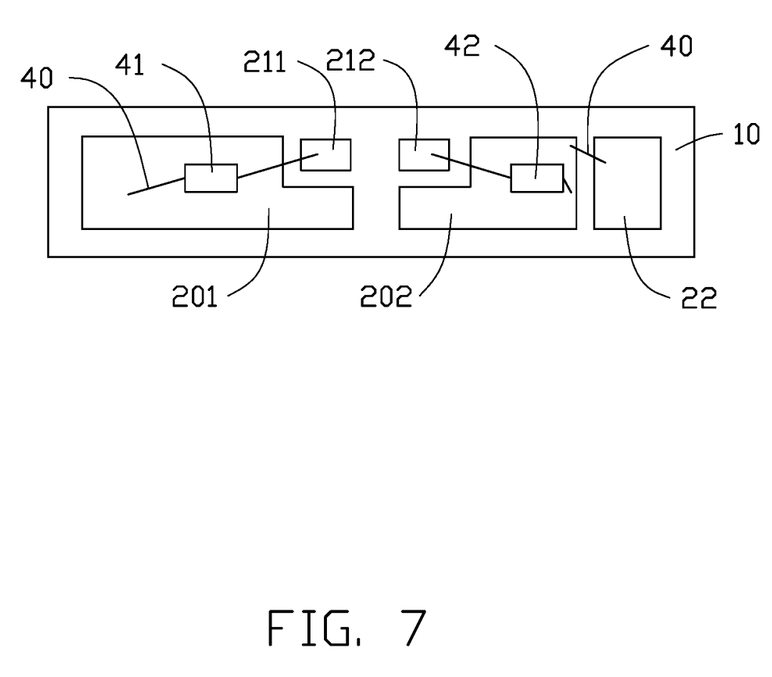
FIG. 7 is a top planar view of a light emitting diode package having two light emitting chips electrically connecting with each other in parallel on the lead frame of FIG. 1.
Figure 8:
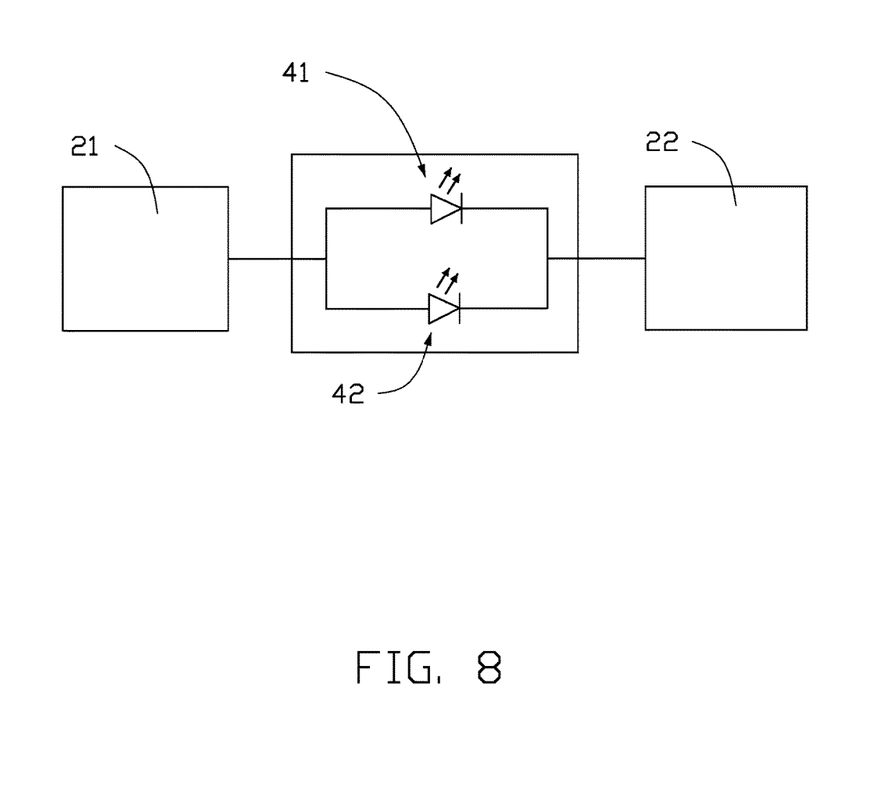
FIG. 8 is an equivalent circuit diagram of the light emitting diode package of FIG. 7.

Referring to FIGS. 7-8, the first light emitting chip 41 is mounted on the first bonding surface 201 and the second light emitting chip 42 is mounted on the second bonding surface 202. The first light emitting chip 41 electrically connects with the first bonding surface 201 and the first connecting surface 211 of the first connecting electrode 21 by two wires 40. The second light emitting chip 42 electrically connects with the second connecting surface 212 and the second bonding surface 202 by two wires 40. The second bonding surface 202 electrically connects with the second connecting electrode 22 by a single wire 40.

The first light emitting chip 41 and the second light emitting chip 42 electrically connect with each other in parallel, as shown in FIG. 8.

In the above configuration, the first light emitting chip 41 and the second light emitting chip 42 can be electrically connected with each other on the lead frame 100 either in series or in parallel, and the electrical wiring between the first light emitting chip 41 and the second light emitting chip 42 is rendered versatile.

Figure 9:
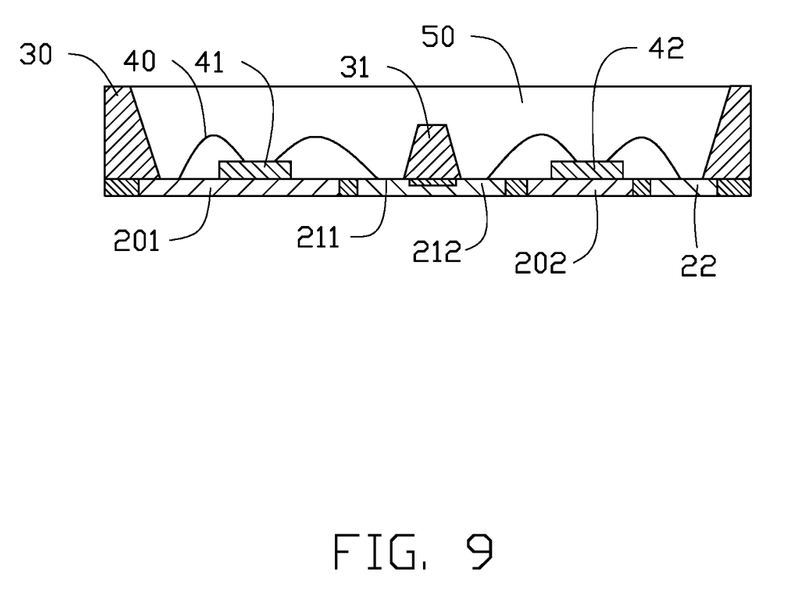
FIG. 9 is a cross-sectional view of a light emitting diode package having a reflector and two light emitting chips connecting with each other in series on the lead frame of FIG. 1.

Referring to FIG. 9, an encapsulation layer 50 is formed to cover the first light emitting chip 41, the second light emitting chip 42, and the dam 31 in the reflector 30. The encapsulation layer 50 is made of transparent materials, such as epoxy resin or silicone. The encapsulation layer 50 can be doped with phosphor powders. In at least one embodiment, light emitted from the first light emitting chip 41 and light emitted from the second light emitting chip 42 can mix to form white light.

According to the present disclosure, the bonding electrode 20 being made of metallic materials ensures good thermal conductivity. The bottom surface of the bonding electrode 20 occupies more than eighty percent of the entire area of the bottom surface of the lead frame 100, and heat generated from the first light emitting chip 41 and the second light emitting chip 42 is rapidly conducted to the bottom surface of the lead frame 100 for dissipation. The heat dissipating efficiency of the light emitting package is high.

The reflector 30 and the substrate 10 are made of reflecting materials, such as EMC or SMC. The reflecting efficiency of the reflector 30 is thus increased to promote light extraction efficiency of the light emitting package.

Figure 10:
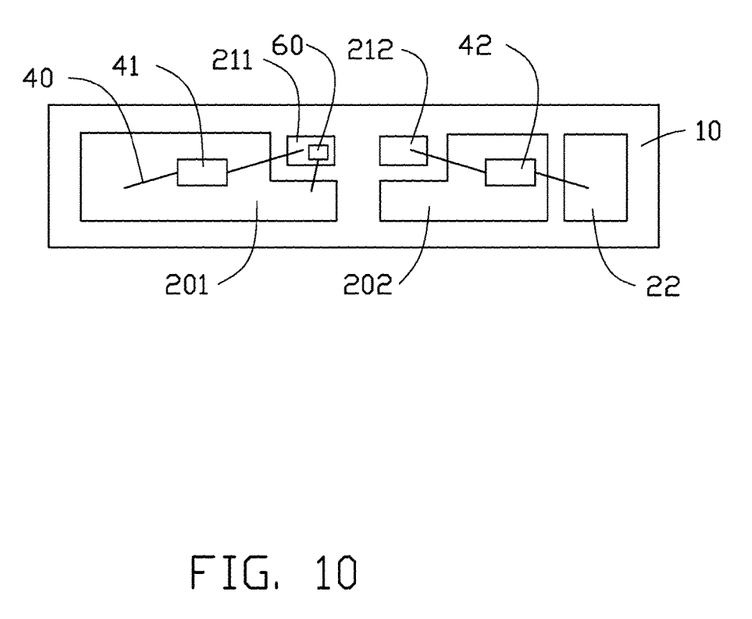
FIG. 10 is a top view of a light emitting diode package having two light emitting chips connecting with each other in series and a zener diode connecting in parallel with one of the two light emitting chips on the lead frame of FIG. 1.

Referring to FIG. 10, when the first and second light emitting chips 41, 42 electrically connect with each other in series, a zener diode 60 electrically connects with the bonding electrode 20 and the first connecting electrode 21. The zener diode 60 electrically connects with the first light emitting chip 41 in parallel, reducing the risk of electrostatic discharge and damage to the first light emitting chip 41. In at least one embodiment, the zener diode 60 is mounted on the top surface of the first bonding surface 201. The zener diode 60 is electrically connects with the first bonding surface 201 by a wire 40, to directly connect with the first connecting surface 211 of the first connecting electrode 21.

Alternatively, in this disclosure, the zener diode 60 can be mounted on the second connecting surface 212 or on the top surface of the substrate 10.

Figure 11:
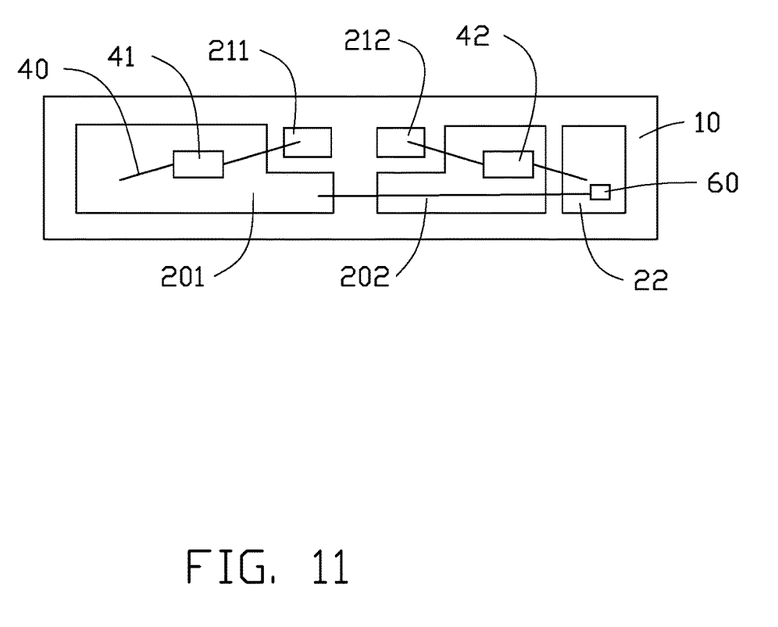
FIG. 11 is a top view of a light emitting diode package having two light emitting chips connecting with each other in series and a zener diode connecting in parallel with the two serially-connected light emitting chips on the lead frame of FIG. 1.

Referring to FIG. 11, the zener diode 60 can be mounted on the second connecting electrode 22 to directly connect by a wire 40 with the bonding electrode 20 and the second connecting electrode 22. This arrangement allows the zener 60 to electrically connect with the serially-connected first and second light emitting chips 41, 42 in parallel. Thereby, electrostatic discharge and damage to the first and second light emitting chips 41, 42 is avoided.

Figure 12:
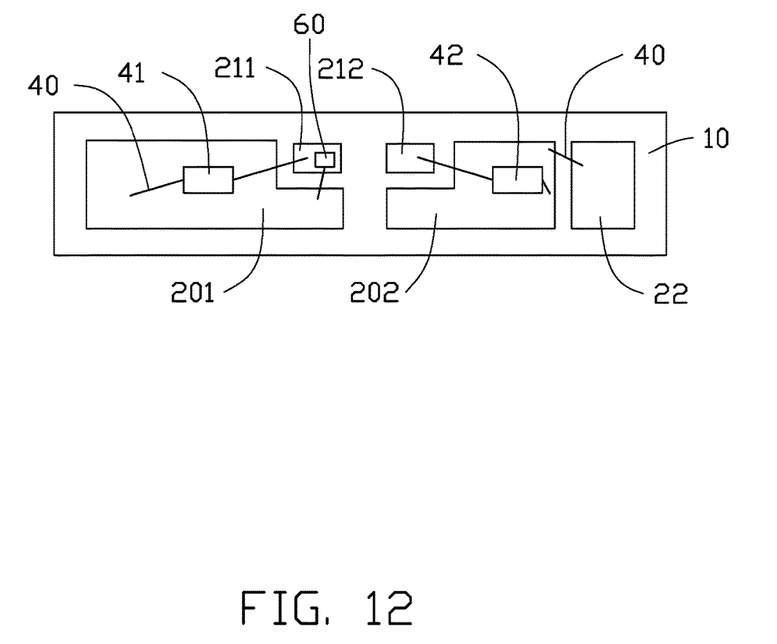
FIG. 12 is a top view of a light emitting diode package having two light emitting chips and a zener diode connecting in parallel with each other on a lead frame of FIG. 1.

Referring to FIG. 12, when the first and second light emitting chips 41, 42 electrically connect with each other to the lead frame 100 in parallel, the zener diode 60 can electrically connect with the bonding electrode 20 and with the first connecting electrode 21 by two wires 40. This arrangement will connect the first light emitting chip 41, the second light emitting chip 41, and the zener diode 60 in parallel on the lead frame 100. In at least one embodiment, the zener diode 60 is mounted on the first connecting surface 211 of the first connecting electrode 21.

The embodiments shown and described above are only examples. Many details are often found in the art such as the other features of the lead frame and light emitting diode package having the same. Therefore, many such details are neither shown nor described. Even though numerous characteristics and advantages of the present technology have been set forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A lead frame for mounting at least a first light emitting chip and a second light emitting chip thereon, comprising:
   a substrate;
   a bonding electrode embedded in the substrate;
   a first connecting electrode embedded in the substrate;
   a second connecting electrode embedded in the substrate;
      wherein the bonding electrode, the first connecting electrode, and the second connecting electrode are spaced apart from each other; wherein a top surface of the bonding electrode comprises a first bonding surface, and a second bonding surface spaced apart from the first bonding surface; wherein the first connecting electrode comprises a first connecting surface, and a second connecting surface, the second connecting surface is spaced apart from the first connecting surface, the top surfaces of the bonding electrode, the first connecting electrode, and the second connecting electrode being exposed and coplanar with the substrate; wherein the first bonding surface supports the first light emitting chip thereon, the second bonding surface supports the second light emitting chip thereon; wherein the first light emitting chip is mounted on the first bonding surface of the bonding electrode, and electrically connects with the first bonding surface and one of the first and second connecting surfaces of the first connecting electrode; wherein the second light emitting chip is mounted on the second bonding surface of the bonding electrode, and electrically connects with the second bonding surface and one of the first and second connecting surfaces of the first connecting electrode; and wherein one of the first and second connecting surfaces of the first connecting electrode electrically connects with the second connecting electrode by a wire; and
   a zener diode, the zener diode being electrically connected with the first connecting electrode and the bonding electrode; wherein the zener diode is mounted on one of the first and second connecting surfaces of the first connecting electrode, and the zener diode electrically connects with the one of the first and second connecting surfaces and one of the first and second bonding surfaces of the bonding electrode.

2. The lead frame of claim 1, wherein the second light emitting chip electrically connects with the second bonding surface by a wire and electrically connects with the second connecting electrode by a wire.

3. The lead frame of claim 1, wherein the second light emitting chip electrically connects with the second connecting electrode by a wire.

4. The lead frame of claim 1, further comprising an encapsulation layer, the encapsulation layer covers the first and second light emitting chips.

* * * * *